United States Patent
Endres

(10) Patent No.: US 9,632,422 B2
(45) Date of Patent: Apr. 25, 2017

(54) ILLUMINATION OPTICAL UNIT

(71) Applicant: Carl Zeiss SMT GmbH, Oberkochen (DE)

(72) Inventor: Martin Endres, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 59 days.

(21) Appl. No.: 14/050,560

(22) Filed: Oct. 10, 2013

(65) Prior Publication Data

US 2014/0036247 A1 Feb. 6, 2014

Related U.S. Application Data

(63) Continuation of application No. PCT/EP2012/059173, filed on May 16, 2012.

(60) Provisional application No. 61/488,901, filed on May 23, 2011.

(30) Foreign Application Priority Data

May 23, 2011 (DE) .......... 10 2011 076 297

(51) Int. Cl.
   *G03B 27/72* (2006.01)
   *G03F 7/20* (2006.01)
   *G21K 1/02* (2006.01)

(52) U.S. Cl.
   CPC .......... *G03F 7/70075* (2013.01); *G03F 7/702* (2013.01); *G03F 7/70033* (2013.01); *G03F 7/70158* (2013.01); *G03F 7/70175* (2013.01); *G03F 7/70233* (2013.01); *G21K 1/02* (2013.01)

(58) Field of Classification Search
   CPC ............. G03F 7/70033; G03F 7/70075; G03F 7/70158; G03F 7/70175; G03F 7/702; G03F 7/70233; G21K 1/02
   USPC ........................................ 355/67, 71
   See application file for complete search history.

(56) References Cited

U.S. PATENT DOCUMENTS

| 6,452,661 | B1 | 9/2002 | Komatsuda |
| 6,690,455 | B2 | 2/2004 | Fujinaka |
| 6,859,515 | B2 | 2/2005 | Schultz et al. |
| 2005/0264787 | A1 | 12/2005 | Mann et al. |
| 2006/0109436 | A1 | 5/2006 | Van Der Laan et al. |

(Continued)

FOREIGN PATENT DOCUMENTS

| CN | 1707363 A | 12/2005 |
| CN | 101454724 A | 6/2009 |

(Continued)

OTHER PUBLICATIONS

German Examination Report, with translation thereof, for corresponding DE Appl No. 10 2011 076 297.3, dated Jan. 30, 2012.

(Continued)

*Primary Examiner* — Peter B Kim
(74) *Attorney, Agent, or Firm* — Fish & Richardson P.C.

(57) ABSTRACT

An illumination optical unit for an EUV projection exposure apparatus has a diaphragm comprising a radiation-transmissive region having a discrete symmetry group. The form of the diaphragm is adapted to the form of the facets of a pupil facet mirror or to the form of the radiation source. The diaphragm is preferably arranged in the region of an intermediate focal plane.

25 Claims, 4 Drawing Sheets

(56) References Cited

U.S. PATENT DOCUMENTS

| | | | |
|---|---|---|---|
| 2007/0115449 A1* | 5/2007 | Dierichs | G03F 7/70075 355/68 |
| 2007/0242799 A1 | 10/2007 | Weiss et al. | |
| 2008/0049206 A1 | 2/2008 | Ossmann | |
| 2008/0225387 A1 | 9/2008 | Hainz et al. | |
| 2010/0020304 A1* | 1/2010 | Soer | G03F 7/70191 355/71 |
| 2010/0253926 A1 | 10/2010 | Endres et al. | |
| 2011/0001947 A1 | 1/2011 | Dinger et al. | |
| 2011/0024651 A1 | 2/2011 | Schimmel et al. | |

FOREIGN PATENT DOCUMENTS

| | | |
|---|---|---|
| CN | 101896869 A | 11/2010 |
| DE | 102009 047180 | 12/2010 |
| EP | 1605312 A | 12/2005 |
| JP | 2001-338868 | 12/2001 |
| JP | 2009-512223 | 3/2009 |
| JP | 2010-502004 | 1/2010 |
| JP | 2011-503869 | 1/2011 |
| JP | 2011-512659 | 4/2011 |

OTHER PUBLICATIONS

International Search Report for corresponding PCT Appl. No. PCT/EP2012/059173, dated Nov. 28, 2012.
SIPO of People's Republic of China Office Action corresponding to Chinese Patent Application No. 201280025144.1 dated Sep. 2, 2015 with English translation thereof.
Japanese Office Action with translation thereof for corresponding JP Appln. 2014-511820, dated Mar. 4, 2016.
Chinese office action, with English translation, for corresponding CN Appl No. 201280025144.1, Jul. 26, 2016.

* cited by examiner

ILLUMINATION OPTICAL UNIT

The contents of German patent application DE 10 2011 076 297.3 and U.S. 61/488,901 are incorporated by reference.

The invention relates to an illumination optical unit and an illumination system comprising a diaphragm. Moreover, the invention relates to an EUV projection exposure apparatus comprising an illumination system of this type, a method for producing a micro- or nanostructured component, and a component produced by the method.

It is known that the optical quality of an exposure apparatus can be improved by suitable arrangement of one or a plurality of diaphragms. An EUV projection exposure apparatus comprising a diaphragm is known from US 2007/242799 A1, for example.

Circular diaphragms are known from the prior art. According to the invention, it has been recognized that this does not constitute the optimum design of a diaphragm.

Therefore, it is an object of the invention to improve an illumination optical unit for an EUV projection exposure apparatus.

This object is achieved by an illumination optical unit for illuminating an object field that can be imaged by an imaging optical unit with radiation emitted from an EUV radiation source. The illumination optical unit includes a pupil facet mirror having a multiplicity of facets of a specific form, and a diaphragm. The diaphragm includes a first region which is transmissive to impinging EUV radiation, and a second region which is opaque to impinging EUV radiation. The regions define a diaphragm plane. At least one of the regions has a discrete symmetry group in the diaphragm plane. The diaphragm is arranged in the region of an intermediate focal plane of the EUV radiation source. At least one of the regions of the diaphragm has a form which is adapted to the form of the facets of the pupil facet mirror or to the form of the radiation source.

According to the invention, it has been recognized that the form of the diaphragm also has a significant influence on the imaging quality of the projection exposure apparatus. It has surprisingly been established that a circular diaphragm form is often not optimal, rather that a diaphragm embodied e.g. in polygonal fashion leads to improved transmission properties and thus to an improved imaging quality. The diaphragm has a radiation-transmissive region having, in particular, a discrete symmetry group in the diaphragm plane. The discrete symmetry is, in particular, a non-trivial n-fold rotational symmetry, where n>2, in particular 2<n<10, in particular n=2 or n=4. In this case, the diaphragm can be embodied as a circumferential diaphragm. It circumferentially delimits the beam path. The frame of the diaphragm can also have a direct symmetry group. The latter corresponds, in particular, to the symmetry group of the diaphragm opening.

According to an advantageous embodiment, the form of the diaphragm is adapted to the form of the facets of a facet element of the illumination optical unit. Advantageously, the form of the diaphragm is adapted, in particular, to the form of the pupil facets. In the case of rectangular facets, the diaphragm advantageously likewise has a rectangular form. In this case, the aspect ratio of the diaphragm advantageously corresponds exactly to the aspect ratio of the facets. In particular, a square embodiment of the diaphragm is advantageous in the case of square facets.

According to a further advantageous embodiment, the form of the diaphragm is adapted to the form of the radiation source. This is advantageous particularly in the case of an arrangement of the diaphragm in the region of an intermediate image of the radiation source. As a result, the stability of the illumination of the object field can be improved further.

A rectangular embodiment of the diaphragm in which at least one of the regions of the diaphragm is embodied in rectangular fashion makes it possible for the form of the diaphragm to be adapted particularly well to the embodiment of the projection exposure apparatus and/or of the object to be imaged. As a special case the rectangular embodiment of the diaphragm can be embodied, in particular, in square fashion.

According to an embodiment in which the first region of the diaphragm is marginally surrounded completely by the second region, the diaphragm is embodied as an aperture stop. This is advantageous, in particular, if the frame of the diaphragm has further, in particular mechanical, functions.

The diaphragm is in particular embodied as an intermediate focus diaphragm, that is to say that it is arranged in the region of an intermediate focal plane of the radiation source.

The form of the diaphragm is in particular adapted to the intensity distribution of the EUV radiation coming from the EUV radiation source. In this case, in particular the embodiment of the EUV radiation source and the structural details of the collector can be taken into account. Such an adaptation of the form of the diaphragm, in particular of the diaphragm opening, makes it possible to optimize, in particular, the transmission properties, for example the total intensity, of the EUV radiation emerging from the source unit, under the secondary condition that the diaphragm opening is as small as possible, in order to achieve a good vacuum separation between the radiation source and the illumination optical unit.

A further object of the invention consists in improving an illumination system of an EUV projection exposure apparatus.

This object is achieved by an illumination system for illuminating an object field that can be imaged by an imaging optical unit with radiation emitted from an EUV radiation source. The illumination system includes a source unit and an illumination optical unit as described above. The diaphragm is arranged in the region of an intermediate focal plane of the EUV radiation source.

The advantages of an illumination system of this type correspond to those which have been described above for the illumination optical unit.

A vacuum separation may be provided between the source unit and the illumination optical unit, and the diaphragm may be arranged at a boundary between the source unit and the illumination optical unit. The diaphragm is arranged at the boundary between the source unit and the illumination optical unit. The vacuum separation between the source unit and the illumination optical unit can be improved as a result.

Further objects of the invention are to specify a projection exposure apparatus comprising the illumination optical unit according to the invention, a method for producing a component using the projection exposure apparatus, and a component produced by the method.

These objects are achieved according to the invention by a projection exposure apparatus according to including an illumination system described above and and imaging optical unit for imaging the object field into an image field, a production method that includes using such a projection exposure apparatus, and by a component according to such a method.

The advantages of these subjects correspond to those which have already been discussed above.

Exemplary embodiments of the invention are explained in greater detail below with reference to the drawings, in which:

FIG. 1 schematically shows a meridional section through a projection exposure apparatus for EUV projection lithography;

Figure 1:
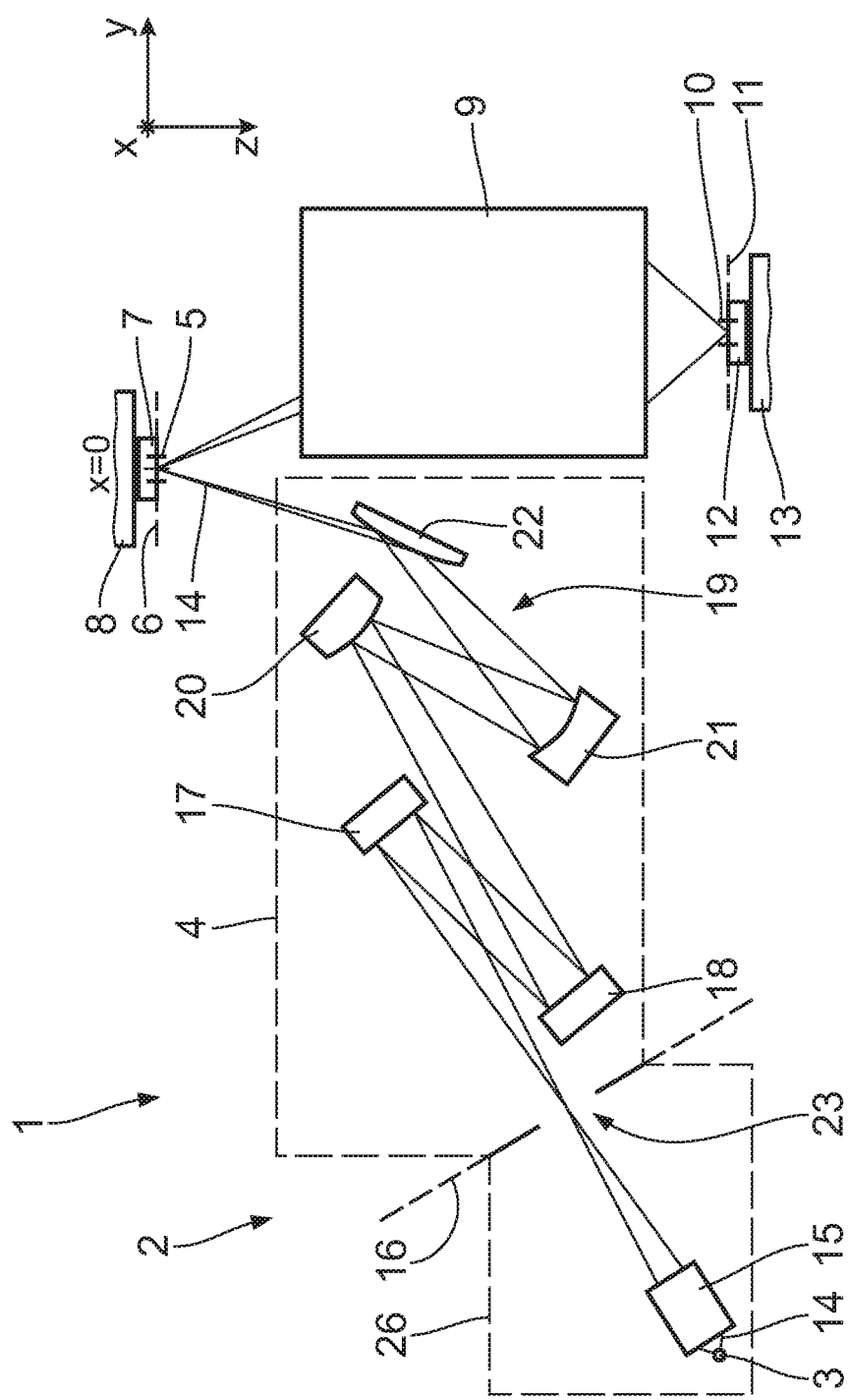

FIG. 1 schematically shows in a meridional section a projection exposure apparatus 1 for microlithography. An illumination system 2 of the projection exposure apparatus 1 has, besides a radiation source 3, an illumination optical unit 4 for exposing an object field 5 in an object plane 6. A recticle 7 arranged in the object field 5, the reticle being held by a recticle holder 8 illustrated merely as an excerpt is exposed in this case. A projection optical unit 9 serves for imaging the object field 5 into an image field 10 into an image plane 11. A structure on the reticle 7 is imaged onto a light-sensitive layer of a wafer 12 arranged in the region of the image field 10 in the image plane 11, the wafer being held by a wafer holder 13 likewise illustrated schematically.

The radiation source 3 is an EUV radiation source having an emitted used radiation in the range of between 5 nm and 30 nm. This can involve a plasma source, for example a GDPP (gas discharge-produced plasma) source or an LPP (laser-produced plasma) source. A radiation source placed on a synchrotron can also be used for the radiation source 3. Information about a radiation source of this type can be found by the person skilled in the art for example from U.S. Pat. No. 6,859,515 B2. EUV radiation 14 emerging from the radiation source 3 is concentrated by a collector 15. Downstream of the collector 15, the EUV radiation 14 propagates through an intermediate focal plane 16 before it impinges on a field facet mirror 17. The field facet mirror 17 is arranged in a plane of the illumination optical unit 4 which is optically conjugate with respect to the object plane 6.

The EUV radiation 14 is also designated hereinafter as illumination light or as imaging light.

Figure 3:
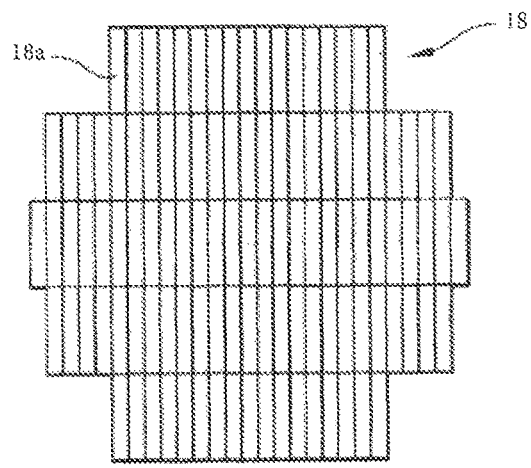
FIG. 3 shows a pupil facet mirror with rectangular pupil facets.
Figure 4:
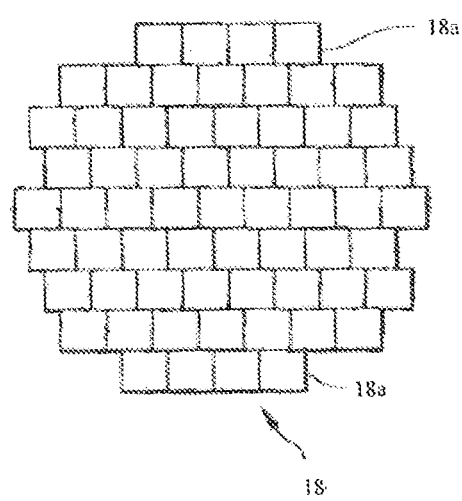
FIG. 4 shows a pupil facet mirror with square pupil facets.

Downstream of the field facet mirror 17, the EUV radiation 14 is reflected from a pupil facet mirror 18 having a multiplicity of pupil facets. In particular, each field facet images the intermediate focus onto a pupil facet assigned to it. The assignment between the field facets and the pupil facets can be switchable. The pupil facets can be embodied in rectangular fashion, in particular in square fashion. FIG. 3 shows a pupil facet mirror 18 with rectangular pupil facets 18a. FIG. 4 shows a pupil facet mirror 18 with rectangular pupil facets 18a. For details in this regard, reference should be made to U.S. Pat. No. 6,452,661, in particular FIG. 15 and FIG. 23. The pupil facet mirror 18 is arranged in a pupil plane of the illumination optical unit 4 which is optically conjugate with respect to a pupil plane of the projection optical unit 9. With the aid of the pupil facet mirror 18 and an imaging optical assembly in the form of a transfer optical unit 19 having mirrors 20, 21 and 22 designated in the order of the beam path, field facets of the field facet mirror 17 are imaged into the object field 5. The field facets have a form adapted to the form of the object field 5. They are embodied, in particular, in rectangular or arcuate fashion. The last mirror 22 of the transfer optical unit 19 is a mirror for grazing incidence ("grazing-incidence mirror"). The pupil facet mirror 18 and the transfer optical mirror 19 form a subsequent optical unit for transferring the illumination light 14 into the object field 5. The transfer optical unit 19 can be dispensed with particularly when the pupil facet mirror 18 is arranged in an entrance pupil of the projection optical unit 9. For further details of the illumination optical unit 4, reference should be made to U.S. Pat. No. 6,452,661.

For simpler description of positional relationships, a Cartesian xyz coordinate system is depicted in FIG. 1. The x-axis runs perpendicularly to the plane of the drawing into the latter in FIG. 1. The y-axis runs toward the right. The z-axis runs downward. The object plane 6 and the image plane 11 both run parallel to the xy plane.

The recticle holder 8 is displaceable in a controlled manner such that, during the projection exposure, the recticle 7 can be displaced in a displacement direction in the object plane 6 parallel to the y-direction. The wafer holder 13 is correspondingly displaceable in a controlled manner such that the wafer 12 is displaceable in a displacement direction in the image plane 11 parallel to the y-direction. As a result, the reticle 7 and the wafer 12 can be scanned firstly through the object field 5 and secondly through the image field 10. The displacement direction is also designated as the scanning direction. The displacement of the reticle 7 and of the wafer 12 in the scanning direction can preferably be effected synchronously with one another.

Figure 2:
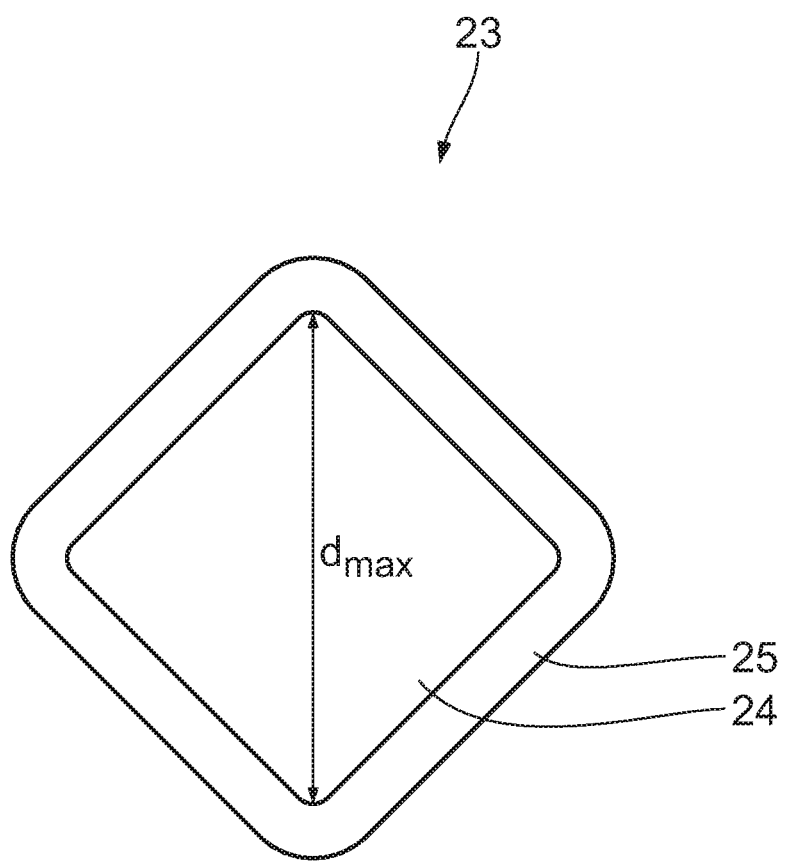
FIG. 2 shows a schematic illustration of a diaphragm for an EUV projection exposure apparatus according to FIG. 1.

A diaphragm 23 is arranged in the intermediate focal plane 16. A schematic illustration of the diaphragm 23, from which further details can be gathered, is represented in FIG. 2. The diaphragm 23 comprises a first region, which is embodied, in particular, as an opening 24, and a second region, which is embodied as a frame 25. The first region is transmissive to impinging EUV radiation. In this case, transmissive should be understood to mean that the first region 24 has a transmittance of at least 80%, of at least 90%, of at least 95%, of at least 98%, or even of more than 99%, for the impinging EUV radiation 14. The opaque second region 25 correspondingly has a transmittance of at most 5%, of at most 1%, or of at most 0.1%.

The regions 24, 25 define a diaphragm plane, which coincides with the intermediate focal plane 16 in the exemplary embodiment illustrated in FIG. 1. The diaphragm plane is oriented, in particular, perpendicularly to an optical axis of the projection exposure apparatus 1.

In the exemplary embodiment illustrated, the regions 24, 25 are embodied in rectangular fashion, in particular in square fashion. However, they have rounded corners. Expressed generally, the regions 24, 25 are embodied in polygonal fashion. In particular, at least one of the regions 24, 25 has a discrete symmetry group in the diaphragm plane. In other words, the diaphragm 23 has a non-trivial, n-fold rotational symmetry, but no circular symmetry. Consequently, n>2 holds true. In particular 2<n<10, in particular n=2 or n=4 holds true. By way of example, the square diaphragm 23 illustrated in FIG. 2 has a four-fold rotational symmetry, while a rectangular diaphragm having an aspect ratio not equal to 1 has only a two-fold, but not a four-fold rotational symmetry. The aspect ratio of the diaphragm 23 corresponds, in particular, to the aspect ratio of the pupil facets on the pupil facet mirror 18.

In the exemplary embodiment illustrated in FIG. 2, the first region 24 is marginally surrounded completely by the second region 25. The diaphragm 23 is thus embodied as a circumferential diaphragm.

The diaphragm 23 can be part of a source unit 26. The source unit 26 additionally comprises the radiation source 3 and the collector 15. Since the diaphragm 23 is arranged in the intermediate focal plane 16, the radiation-transmissive first region 24 can be made very small. It has, in particular, a maximum diameter $d_{max}$ in the range of 1 mm to 50 mm, in particular in the range of 3 mm to 30 mm, in particular in the range of 5 mm to 15 mm. The smaller the transmissive region 24, the better the source unit 26 can be separated, in particular vacuum-separated, from the illumination optical unit 4. A vacuum separation between the source unit 26 and the illumination optical unit 4 is important, in particular, if an atmosphere that is harmful to the illumination optical unit 4 is present in the source unit 26.

In order to transfer the EUV radiation 14 emerging from the radiation source 3 from the source unit 26 to the illumination optical unit 4 in a manner as free from losses as possible, it is advantageous if the radiation-transmissive first region 24 has a form which is adapted to the intensity distribution of the EUV radiation 14 at the position of the diaphragm 23, in particular in the region of the intermediate focal plane 16.

The diaphragm 23 can also be part of the illumination optical unit 4. It is advantageous if the radiation-transmissive first region 24 of the diaphragm 23 has a form which is adapted to the form of the pupil facets of the pupil facet mirror 18.

Particularly in the case of a square embodiment of the pupil facets, a square embodiment of the diaphragm 23, in particular of the first region 24 of the diaphragm 23, is advantageous. The diaphragm 23 has, in particular, the same symmetry properties as the pupil facets.

When the projection exposure apparatus 1 is used, the reticle 7 and the wafer 12, which bears a coating light-sensitive to the illumination light 14, are provided. Afterward, at least one section of the recticle 7 is projected onto the wafer 12 with the aid of the projection exposure apparatus 1. During the projection of the recticle 7 onto the wafer 12, the recticle holder 8 and/or the wafer holder 13 can be displaced in a direction parallel to the object plane 6 and/or parallel to the image plane 11, respectively. The displacement of the recticle 7 and of the wafer 12 can preferably be effected synchronously with one another. The final step involves developing the light-sensitive layer exposed via the illumination light 14 on the wafer 12. A micro- or nano-structured component, in particular a semiconductor chip, is produced in this way.

It has surprisingly been established that the stability of the uniformity U of the illumination of the object field 5 for a predefined size of the radiation-transmissive first region 24 of the diaphragm 23 is improved via a square embodiment of the region in comparison with a circular embodiment. This was attributable to the fact that disturbances in the uniformity which can be caused by an incorrect positioning of the radiation source 3 are smaller in the case of a square embodiment of the radiation-transmissive first region 24 of the diaphragm 23 than in the case where a round diaphragm is used. The diaphragm 23 according to the invention thus contributes to an improved imaging quality of the projection exposure apparatus 1.

Figure 5:
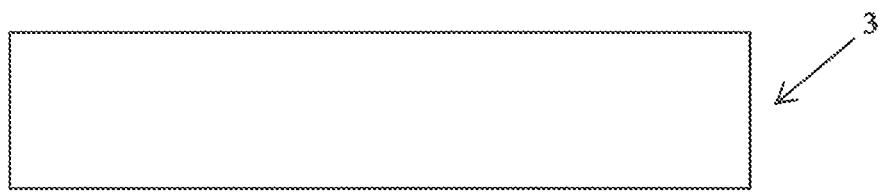
FIG. 5 shows a rectangular radiation source.
Figure 6:
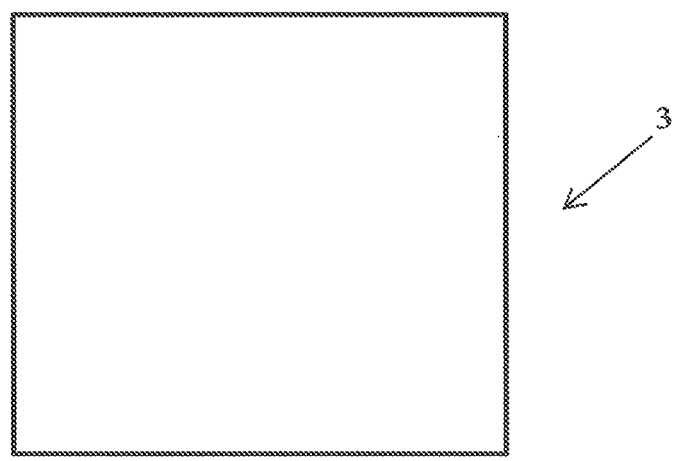
FIG. 6 shows a square radiation source.

It was furthermore established that the advantages brought about by the diaphragm 23 according to the invention are also dependent, inter alia, on the concrete configuration of the radiation source 3. In one particular advantageous embodiment, the design of the radiation-transmissive first region 24 of the diaphragm 23 is adapted to the concrete form of the radiation source 3. This adaptation can be as an alternative or in addition to the adaptation to the form of the pupil facets on the pupil facet mirror 18. An adaptation of the diaphragm 23 to the form of the radiation source 3 is advantageous, in particular, in the case of an arrangement of the diaphragm 23 in the intermediate focal plane 16, since an intermediate image of the radiation source 3 is present here. A roundish embodiment of the radiation source 3 will lead to a roundish intermediate image. Correspondingly, an oval embodiment of the radiation source 3 leads to an oval intermediate image and a rather rectangular, in particular square, embodiment of the radiation source 3 leads to a corresponding intermediate image. FIG. 5 shows a rectangular radiation source. FIG. 6 shows a square radiation source 3. According to the invention, provision can be made, in the case of the radiation source 3 being replaced, for the diaphragm 23 also to be replaced by a new diaphragm 23 adapted to the new radiation source 3.

An improved uniformity of the illumination of the object field 5 leads to a greater stability of the illumination. This is advantageous, in particular, if, during the exposure of the wafer 12, the radiation source 3 is not absolutely stationary, for example wobbles somewhat. This is relevant, in particular, when a point source in the intermediate focal plane 16 is not imaged exactly onto a point on the pupil facets of the pupil facet mirror 18 by the field facets of the field facet mirror 17, rather the position on the pupil facets correlates with the position on the field facet and thus with the position in the recticle 7.

The invention claimed is:

1. An illumination optical unit, comprising:
   a pupil facet mirror comprising a multiplicity of facets having a form; and
   a diaphragm comprising first and second regions,
   wherein:
      the illumination optical unit is configured to illuminate an object field imageable via an imaging optical unit with radiation from an EUV radiation source;
      the first region is transmissive to the EUV radiation;
      the second region is opaque to the EUV radiation;
      the first and second regions define a diaphragm plane;
      at least one region selected from the group consisting of the first region and the second region has a discrete symmetry group in the diaphragm plane;
      the diaphragm is in a region of an intermediate focal plane of the illumination optical unit; and
      the at least one region has a rectangular form with an aspect ratio corresponding exactly to an aspect ratio of the facets of the pupil facet mirror.

2. The illumination optical unit of claim 1, wherein the first region is marginally surrounded completely by the second region.

3. An illumination system, comprising:
   an EUV radiation source; and
   an illumination optical unit configured to illuminate an object field imageable via an imaging optical unit with radiation from the EUV radiation source, the illumination optical unit comprising:
      a pupil facet mirror comprising a multiplicity of facets having a form; and
      a diaphragm comprising first and second regions,
   wherein:
      the first region is transmissive to the EUV radiation;
      the second region is opaque to the EUV radiation;
      the first and second regions define a diaphragm plane;
      at least one region selected from the group consisting of the first region and the second region has a discrete symmetry group in the diaphragm plane,
      the at least one region has a rectangular form with an aspect ratio corresponding exactly to an aspect ratio of the facets of the pupil facet mirror; and the diaphragm is in a region of an intermediate focal plane of illumination system.

4. The illumination system of claim 3, wherein a vacuum separation is between a source unit comprising the EUV radiation source and the illumination optical unit, and the diaphragm is at a boundary between the source unit and the illumination optical unit.

5. The illumination system of claim 3, wherein the first region is marginally surrounded completely by the second region.

6. An apparatus, comprising:
an illumination system, comprising:
an EUV radiation source; and
an illumination optical unit, comprising:
a pupil facet mirror comprising a multiplicity of facets having a form; and
a diaphragm comprising first and second regions; and
an imaging optical unit configured to image the object field into an image field,
wherein:
the illumination optical unit configured to illuminate the object field;
the first region is transmissive to the EUV radiation;
the second region is opaque to the EUV radiation;
the first and second regions define a diaphragm plane;
at least one region selected from the group consisting of the first region and the second region has a discrete symmetry group in the diaphragm plane;
the at least one region has rectangular form with an aspect ratio corresponding exactly to an aspect ratio of the facets of the pupil facet mirror;
the diaphragm is in a region of an intermediate focal plane of the illumination system; and
the apparatus is an EUV projection exposure apparatus.

7. The apparatus of claim 6, wherein a vacuum separation is between a source unit comprising the EUV radiation source and the illumination optical unit, and the diaphragm is at a boundary between the source unit and the illumination optical unit.

8. A method of using an EUV projection exposure apparatus which comprises an illumination system and an imaging optical unit, the method comprising:
using the illumination system to illuminate a reticle; and
using the imaging optical unit to project a section of the reticle onto a light-sensitive material,
wherein the EUV projection exposure apparatus is an EUV projection exposure apparatus of claim 6.

9. The apparatus of claim 6, wherein the first region is marginally surrounded completely by the second region.

10. An apparatus, comprising:
an illumination optical unit, comprising:
a pupil facet mirror comprising a multiplicity of facets having a form; and
a diaphragm comprising first and second regions; and
an imaging optical unit configured to image the object field into an image field,
wherein:
the illumination optical unit is configured to illuminate the object field imageable via an imaging optical unit with radiation from an EUV radiation source;
the first region is transmissive to the EUV radiation;
the second region is opaque to the EUV radiation;
the first and second regions define a diaphragm plane;
at least one region selected from the group consisting of the first region and the second region has a discrete symmetry group in the diaphragm plane;
the diaphragm is in a region of an intermediate focal plane of the illumination optical unit;
the at least one region has a rectangular form with an aspect ratio corresponding exactly to an aspect ratio of the facets of the pupil facet mirror; and
the apparatus is an EUV projection exposure apparatus.

11. The apparatus of claim 10, wherein a vacuum separation is between a source unit comprising the EUV radiation source and the illumination optical unit, and the diaphragm is at a boundary between the source unit and the illumination optical unit.

12. The apparatus of claim 10, wherein the first region is marginally surrounded completely by the second region.

13. A method of using an EUV projection exposure apparatus which comprises an illumination system and an imaging optical unit, the method comprising:
using the illumination system to illuminate a reticle; and
using the imaging optical unit to project a section of the reticle onto a light-sensitive material,
wherein the EUV projection exposure apparatus is an EUV projection exposure apparatus of claim 10.

14. An illumination optical unit, comprising:
a pupil facet mirror comprising a multiplicity of facets having a form; and
a diaphragm comprising first and second regions,
wherein:
the illumination optical unit is configured to illuminate an object field imageable via an imaging optical unit with radiation from an EUV radiation source;
the first region is transmissive to the EUV radiation;
the second region is opaque to the EUV radiation;
the first and second regions define a diaphragm plane;
at least one region selected from the group consisting of the first region and the second region has a two-fold but not a four-fold rotational symmetry in the diaphragm plane;
the at least one region has a form adapted to the form of the facets of the pupil facet mirror; and
the at least one region has a polygonal form.

15. The illumination optical unit of claim 14, wherein the first region is marginally surrounded completely by the second region.

16. The illumination optical unit of claim 14, wherein the diaphragm has the same symmetry properties as the facets of the pupil facet mirror.

17. An illumination system, comprising:
an EUV radiation source; and
the illumination optical unit of claim 14.

18. The illumination system of claim 17, wherein the diaphragm is in a region of an intermediate focal plane of the illumination system.

19. The illumination system of claim 17, wherein:
the illumination system has a vacuum separation between a source unit and the illumination optical unit;
the source unit comprises the EUV radiation source; and
the diaphragm is at a boundary between the source unit and the illumination optical unit.

20. An apparatus comprising:
an illumination system comprising:
an EUV radiation source; and
the illumination optical unit of claim 14,
wherein the apparatus is an EUV projection exposure apparatus.

21. The apparatus of claim 20, wherein the diaphragm is in a region of an intermediate focal plane of the illumination system.

22. The apparatus of claim 20, wherein:
the illumination system has a vacuum separation between a source unit and the illumination optical unit;
the source unit comprises the EUV radiation source; and
the diaphragm is at a boundary between the source unit and the illumination optical unit.

23. A method of using an EUV projection disposure apparatus comprising an illumination system and an imaging optical unit, the method comprising:
using the illumination system to illuminate a reticle; and
using the imaging optical unit to project a section of the reticle onto a light-sensitive material,
wherein the illumination system comprises an EUV radiation source and the illumination optical unit of claim 14.

24. The method of claim 23, wherein the diaphragm is in a region of an intermediate focal plane of the illumination system.

25. The method of claim 23, wherein:
the illumination system has a vacuum separation between a source unit and the illumination optical unit;
the source unit comprises the EUV radiation source; and
the diaphragm is at a boundary between the source unit and the illumination optical unit.

* * * * *

UNITED STATES PATENT AND TRADEMARK OFFICE
CERTIFICATE OF CORRECTION

PATENT NO. : 9,632,422 B2
APPLICATION NO. : 14/050560
DATED : April 25, 2017
INVENTOR(S) : Martin Endres Page 1 of 2

It is certified that error appears in the above-identified patent and that said Letters Patent is hereby corrected as shown below:

In the Specification

Column 1, Line 2, under "ILLUMINATION OPTICAL UNIT", insert:
-- Cross-Reference to Related Applications
The present application is a continuation of, and claims benefit under 35 USC § 120 to, international application PCT/EP2012/059173, filed May 16, 2012, which claims benefit under 35 USC § 119 of German Application No. 10 2011 076 297.3, filed May 23, 2011. International application PCT/EP2012/059173 also claims priority under 35 USC § 119(e) to U.S. Provisional Application No. 61/488,901, filed May 23, 2011. The entire disclosure of international application PCT/EP2012/059173 is incorporated by reference herein. --.

Column 1, Line 42, delete "that" and insert -- than --.

Column 1, Line 48, delete "n > 2," and insert -- $n \geq 2$, --.

Column 1, Line 48, delete "2 < n < 10," and insert -- $2 \leq n \leq 10$, --.

Column 2, Line 61, delete "and and" and insert -- and --.

Column 3, Line 19, delete "recticle" and insert -- reticle --.

Column 3, Line 20, delete "recticle" and insert -- reticle --.

Column 3, Line 23, delete "recticle" and insert -- reticle --.

Column 4, Line 13, delete "recticle" and insert -- reticle --.

Column 4, Lines 14-15, delete "recticle" and insert -- reticle --.

Column 4, Line 52, delete "n > 2" and insert -- $n \geq 2$ --.

Signed and Sealed this
Seventh Day of November, 2017

Joseph Matal
*Performing the Functions and Duties of the
Under Secretary of Commerce for Intellectual Property and
Director of the United States Patent and Trademark Office*

CERTIFICATE OF CORRECTION (continued)
U.S. Pat. No. 9,632,422 B2

Column 4, Line 52, delete "2 < n < 10," and insert -- $2 \leq n \leq 10$, --.

Column 5, Line 32, delete "recticle" and insert -- reticle --.

Column 5, Line 34, delete "recticle" and insert -- reticle --.

Column 5, Line 35, delete "recticle" and insert -- reticle --.

Column 5, Line 38, delete "recticle" and insert -- reticle --.

Column 6, Line 24, delete "recticle" and insert -- reticle --.

In the Claims

Column 7, Line 19, Claim 6, delete "the" and insert -- an --.

Column 7, Line 30, Claim 6, after "has" insert -- a --.

Column 7, Line 56, Claim 10, delete "the" and insert -- an --.